US009031269B2

(12) United States Patent
Bäuml et al.

(10) Patent No.: US 9,031,269 B2
(45) Date of Patent: May 12, 2015

(54) METHOD AND DEVICE FOR FREQUENCY COMPRESSION WITH SELECTIVE FREQUENCY SHIFTING

(75) Inventors: Robert Bäuml, Eckental (DE); Ulrich Kornagel, Erlangen (DE); Thomas Pilgrim, Erlangen (DE)

(73) Assignee: Siemens Medical Instruments Pte. Ltd., Singapore (SG)

( * ) Notice: Subject to any disclaimer, the term of this patent is extended or adjusted under 35 U.S.C. 154(b) by 848 days.

(21) Appl. No.: 13/248,167

(22) Filed: Sep. 29, 2011

(65) Prior Publication Data

US 2012/0076333 A1 Mar. 29, 2012

(30) Foreign Application Priority Data

Sep. 29, 2010 (DE) ........................ 10 2010 041 653

(51) Int. Cl.

| | |
|---|---|
| ***H04R 25/00*** | (2006.01) |
| ***H03G 5/00*** | (2006.01) |
| ***G10L 21/00*** | (2013.01) |
| *G10L 19/02* | (2013.01) |

(52) U.S. Cl.

CPC ............. *G10L 21/00* (2013.01); *G10L 19/0204* (2013.01); *H04R 25/353* (2013.01)

(58) Field of Classification Search

CPC ... G10L 21/00; G10L 19/0204; H04R 25/353

USPC ........................... 381/316, 94.3, 98, 312, 320

See application file for complete search history.

(56) References Cited

U.S. PATENT DOCUMENTS

| | | | | |
|---|---|---|---|---|
| 6,577,739 | B1 | 6/2003 | Hurtig et al. | |
| 7,580,536 | B2 | 8/2009 | Carlile et al. | |
| 8,031,892 | B2 | 10/2011 | Andersen et al. | |
| 2004/0090364 | A1* | 5/2004 | Le Naour et al. | 342/350 |
| 2008/0123886 | A1* | 5/2008 | Andersen et al. | 381/320 |
| 2011/0150256 | A1* | 6/2011 | Baechler et al. | 381/316 |
| 2012/0252356 | A1* | 10/2012 | Lance et al. | 455/12.1 |

FOREIGN PATENT DOCUMENTS

| | | | |
|---|---|---|---|
| EP | 1333700 | A2 | 8/2003 |
| WO | 2005015952 | A1 | 2/2005 |
| WO | 2007000161 | A1 | 1/2007 |

* cited by examiner

*Primary Examiner* — Fan Tsang

*Assistant Examiner* — Eugene Zhao

(74) *Attorney, Agent, or Firm* — Laurence A. Greenberg; Werner H. Stemer; Ralph E. Locher

(57) ABSTRACT

A method and device for frequency compression of audio signals to reduce the occurrence of artifacts. A component of the audio signal having a plurality of frequency channels is shifted from a first frequency channel into a second frequency channel. A dominant instantaneous frequency is determined in the first frequency channel. During shifting or mapping, first the entire first frequency channel, including the dominant instantaneous frequency, is shifted or mapped into the second frequency channel, wherein the dominant instantaneous frequency obtains an intermediate frequency position. A final frequency position for the dominant instantaneous frequency is determined using a predefined compression characteristic in the second frequency channel, starting from the frequency position of the dominant instantaneous frequency in the first frequency channel. Finally, the dominant instantaneous frequency is shifted or mapped from the intermediate frequency position to the final frequency position.

8 Claims, 3 Drawing Sheets

METHOD AND DEVICE FOR FREQUENCY COMPRESSION WITH SELECTIVE FREQUENCY SHIFTING

CROSS-REFERENCE TO RELATED APPLICATION

This application claims the priority, under 35 U.S.C. §119, of German application DE 10 2010 041 653.3, filed Sep. 29, 2010; the prior application is herewith incorporated by reference in its entirety.

BACKGROUND OF THE INVENTION

Field of the Invention

The present invention relates to a method for frequency compression of an audio signal by providing the audio signal in a plurality of frequency channels and shifting or mapping a component of the audio signal from a first frequency channel of the plurality of frequency channels into a second frequency channel of the plurality of frequency channels. The present invention also relates to a corresponding device for frequency compression of an audio signal comprising a shifting device for shifting or mapping a component of the audio signal. The present invention also relates to a hearing apparatus comprising such a device. A hearing apparatus is here taken to mean any noise-emitting device that can be worn in or on the ear, such as a hearing aid, a headset, headphones and the like.

Hearing aids are wearable hearing devices that are used to support the hard of hearing. Different hearing aid designs, such as behind-the-ear hearing aids (BTE), hearing aids with an external receiver (RIC: receiver in the canal) and in-the-ear hearing aids (ITE), for example also concha hearing aids or completely-in-canal hearing aids (ITE, CIC) are provided in order to accommodate the numerous individual requirements. The hearing aids listed by way of example are worn on the outer ear or in the auditory canal. However, bone conduction hearing aids, implantable or vibrotactile hearing aids are also commercially available, moreover. In this case damaged hearing is either mechanically or electrically simulated.

In principle hearing aids have as their fundamental components an input transducer, an amplifier and an output transducer. The input transducer is usually a sound pick-up, for example a microphone and/or an electromagnetic receiver, for example an induction coil. The output transducer is usually implemented as an electroacoustic transducer, for example a miniature loudspeaker, or as an electromechanical transducer, for example a bone conduction receiver. The amplifier is conventionally integrated in a signal processing unit.

The basic construction of a hearing aid is shown in FIG. 1 with reference to an exemplary behind-the-ear hearing aid. One or more microphone(s) 2 for receiving the sound from the environment are fitted in a hearing aid housing 1 for wearing behind the ear. A signal processing unit (SPU) 3, which is also integrated in the hearing aid housing 1, processes the microphone signals and amplifies them. The output signal of the signal processing unit 3 is transmitted to a loudspeaker or receiver 4 which outputs an acoustic signal. The sound is optionally transmitted via a sound tube, which is fixed to an otoplastic in the auditory canal, to the eardrum of the wearer of the aid. Energy is supplied to the hearing aid, and in particular to the signal processing unit 3, by way of a battery (BAT) 5, which is likewise housed in the hearing aid housing 1.

In the case of hearing aids there are substantially two established methods for augmenting speech intelligibility. In most aids a frequency-dependent level equalization is carried out, generally by means of AGC (Automatic Gain Control), to raise signals above the auditory threshold of the hearing-impaired person, so he/she can perceive the signals again. The second method is usually used to supplement the first and is aimed at hearing defects where even by pure amplification of the signal the auditory threshold cannot be attained in certain, typically high, frequencies. These high frequencies are mapped onto a low (audible) frequency range, so they can be raised above the auditory threshold basically by amplification. The method is called frequency compression since the desired frequency range is mapped onto a smaller, more audible frequency range.

There are hearing aids on the market which support frequency compression. The method used therein uses properties of the utilized filter bank for simple implementation. Selective individual channels, dependent inter alia on their instantaneous output, are copied to other channels, so the frequencies contained in these channels, shifted at the output, appear again in another frequency range. Where the channels are mapped to is determined by a mapping rule and can be adjusted, so different compression ratios can be achieved.

FIG. 2 illustrates the principle of frequency compression by simple copying of channels. A plurality of channels is shown in the figure and these are symbolically identified by their center frequencies 10 to 15. By way of example a channel 14' is allocated to the center frequency 14. There is a dominant instantaneous frequency 14" within channel 14'. During frequency compression channel 14' is to be copied, shifted or mapped onto channel 11'. The dominant instantaneous frequency 14" is also shifted onto the target frequency 11" during this shifting. The frequency of the sound (dominant instantaneous frequency 11" and 14") relative to the respective channel center is identical within source and target channels.

Simple copying of the channels does not result in a continuous mapping of source frequency to target frequency, however, as can be seen in the test, shown in FIG. 3, by means of frequency sweep. This shows the output frequency $f_o$ over the input frequency $f_i$. A frequency sweep is applied at the input of signal processing of the hearing aid. A corresponding output signal with the output frequencies $f_o$ is measured at the output of signal processing. The frequency hops 16 can clearly be seen at the channel junctions. The basic mapping characteristic for mapping or shifting of the frequency channels can clearly be seen, however. As a rule slightly weaker artifacts also occur, which are not shown in FIG. 3 and do not play an important role in the present working principle. The problem with this frequency mapping is that two frequencies that follow each other in the input spectrum may be transposed in the output spectrum. This results in sound sequences at the input coming across as scrambled in their frequency compared with the resulting sound sequences at the output, and this can impair the auditory impression.

SUMMARY OF THE INVENTION

It is accordingly an object of the invention to provide a method and device for frequency compression with selective frequency shifting which overcome the above-mentioned disadvantages of the heretofore-known devices and methods of this general type and which provides for an optimization of the frequency compression of an audio signal to the extent that an improved auditory impression results. A corresponding method and a corresponding device shall be provided.

With the foregoing and other objects in view there is provided, in accordance with the invention, a method for frequency compression of an audio signal, the method which comprises:

providing the audio signal in a plurality of frequency channels including a first frequency channel and a second frequency channel;

determining a dominant instantaneous frequency in the first frequency channel;

shifting or mapping a component of the audio signal from a first frequency channel of the plurality of frequency channels into the second frequency channel of the plurality of frequency channels;

the shifting or mapping including:

firstly shifting or mapping the entire first frequency channel, including the dominant instantaneous frequency, into the second frequency channel, with the dominant instantaneous frequency obtaining an intermediate frequency position;

determining a final frequency position for the dominant instantaneous frequency by a predefined compression characteristic in the second frequency channel, starting from the frequency position of the dominant instantaneous frequency in the first frequency channel; and shifting or mapping the dominant instantaneous frequency from the intermediate frequency position to the final frequency position.

In other words, the object are achieved, in accordance with the invention, by a method for frequency compression of an audio signal, by providing the audio signal in a plurality of frequency channels and shifting or mapping a component of the audio signal from a first frequency channel of the plurality of frequency channels into a second frequency channel of the plurality of frequency channels, wherein a dominant instantaneous frequency is determined in the first frequency channel, during the shifting or mapping firstly the entire first frequency channel, including the dominant instantaneous frequency, is shifted or mapped into the second frequency channel, wherein the dominant instantaneous frequency obtains an intermediate frequency position, a final frequency position for the dominant instantaneous frequency is determined by a predefined compression characteristic in the second frequency channel, starting from the frequency position of the dominant instantaneous frequency in the first frequency channel and the dominant instantaneous frequency is shifted or mapped from the intermediate frequency position to the final frequency position.

Furthermore, according to the invention a device for frequency compression of an audio signal is provided, comprising a first shifting device for shifting or mapping a component of the audio signal, which is provided in a plurality of frequency channels, from a first frequency channel of the plurality of frequency channels into a second frequency channel of the plurality of frequency channels, and comprising an estimator for determining a dominant instantaneous frequency in the first frequency channel, wherein using the first shifting device the entire first frequency channel, including the dominant instantaneous frequency, can be shifted or mapped into the second frequency channel in such a way that the dominant instantaneous frequency obtains an intermediate frequency position, a calculating device for determining a final frequency position for the dominant instantaneous frequency by way of a predefined compression characteristic in the second frequency channel, starting from the frequency position of the dominant instantaneous frequency in the first frequency channel, and a second shifting device for shifting or mapping the dominant instantaneous frequency from the intermediate frequency position to the final frequency position.

It is therefore advantageously possible, despite channel-wise shifting, to shift a sound exactly to the position which requires the predefined compression characteristic.

Displacement or mapping of the dominant instantaneous frequency from the intermediate frequency position to the final frequency position preferably takes place by way of amplitude modulation. Amplitude modulation corresponds to a multiplication of the signal by the modulation term $\exp(j\cdot 2\pi\Delta f\cdot t)$. This in turn corresponds in the spectral range to a shifting by the frequency $\Delta f$.

In a special embodiment the second frequency channel is strictly predefined for shifting or mapping the first frequency channel. Calculating time can thus be saved in the case of a channel shift.

In an alternative embodiment the second frequency channel for shifting or mapping the first frequency channel is determined with the aid of the compression characteristic. This means that the second frequency channel for shifting is not predefined here, so one or more frequency channels which can be considered for the second frequency channel can be determined with the aid of the compression characteristic.

As a second frequency channel that one is chosen from a plurality of possible frequency channels in which the dominant instantaneous frequency is arranged next in the respective channel center. Artifacts, which can result due to modulation, may be avoided in this way.

The inventive device for frequency compression can comprise a polyphase filter bank for providing the audio signal in a plurality of frequency channels. It is thereby possible to generate only positive frequencies in the channels.

The inventive device is particularly advantageously used in a hearing apparatus and in particular in a hearing aid. Frequency compression can therefore be implemented with fewer artifacts in the case of hearing aid wearers.

Other features which are considered as characteristic for the invention are set forth in the appended claims.

Although the invention is illustrated and described herein as embodied in a method and device for frequency compression with selective frequency shifting, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The exemplary embodiments described in more detail below are preferred embodiments of the present invention.

Figure 1:
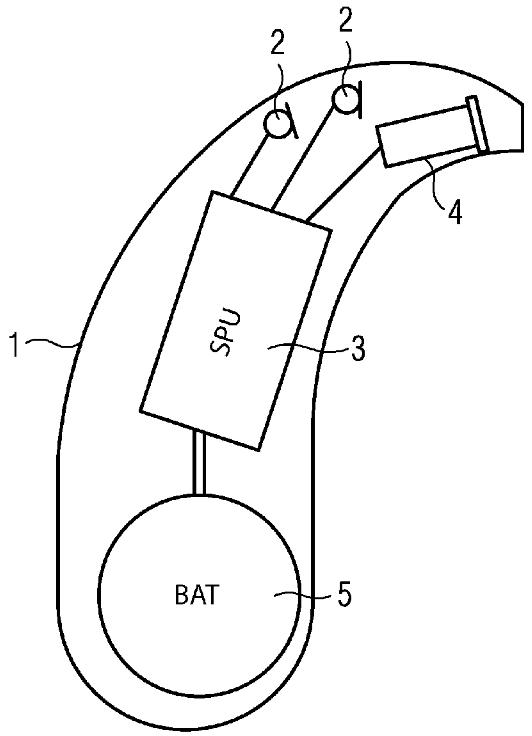
FIG 1 Prior art
FIG. 1 shows the basic structure of a hearing aid according to the prior art.
Figure 2:
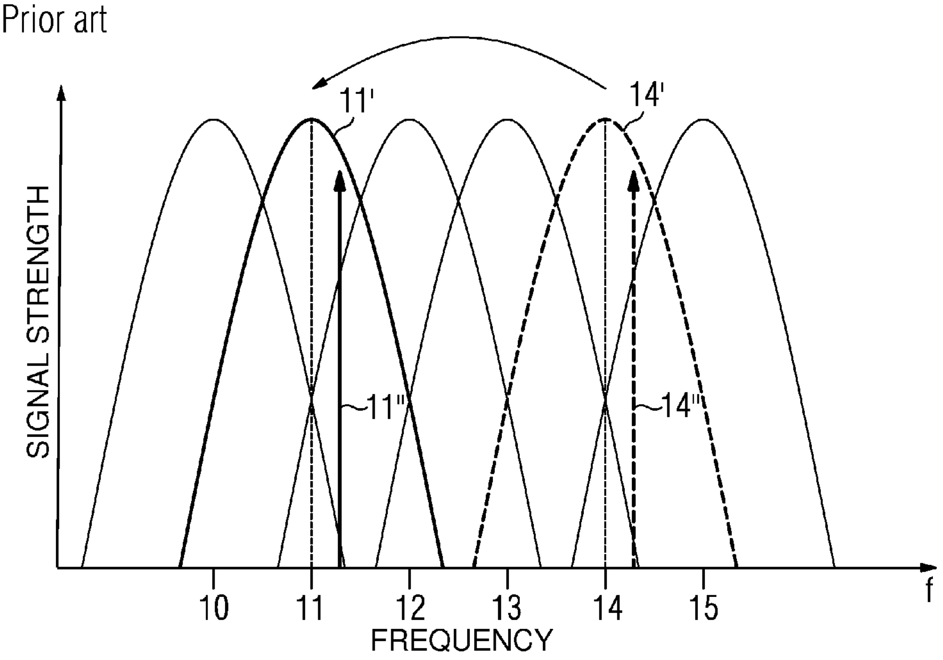
FIG 2 Prior art
FIG. 2 shows the principle of frequency compression by simple copying of channels according to the prior art.
Figure 4:
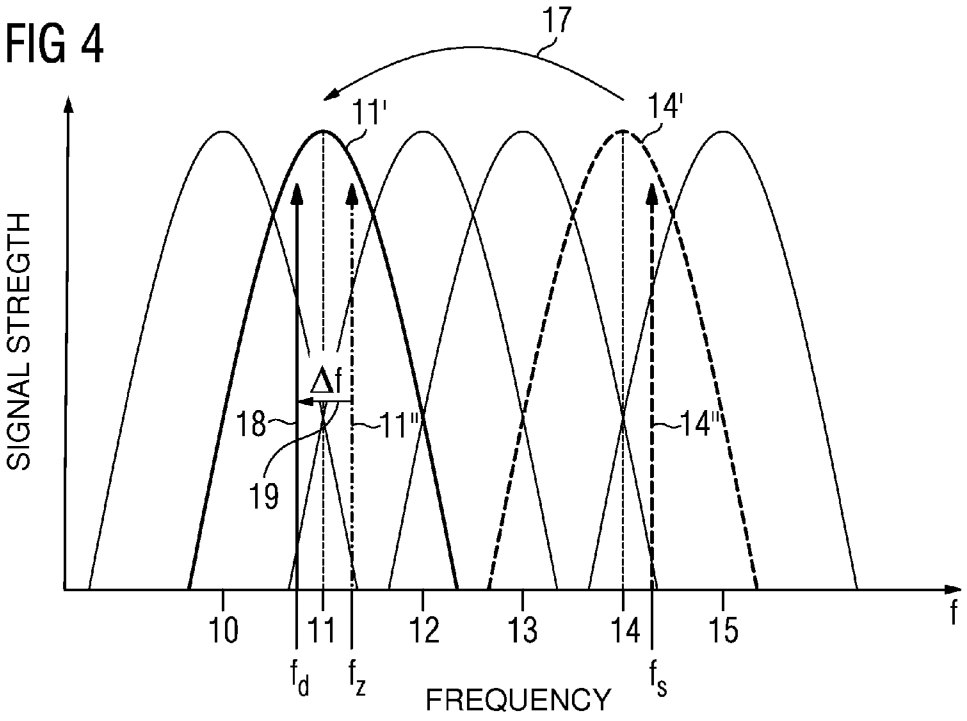
FIG. 4 shows a principle according to the invention of frequency compression by copying channels with subsequent modulation.

FIG. 4 shows a channel arrangement similar to that in FIG. 2. A plurality of channels is reproduced with the center frequencies 10 to 15. As in the known example a shift of the channel 14' to the channel 11' is carried out in a first step 17. There is a sound or a dominant instantaneous frequency 14" within channel 14'. As already described in connection with FIG. 2, this is also shifted here in the first step 17 from a frequency position $f_s$ to the intermediate frequency position $f_z$. The spacing of the intermediate frequency position $f_z$ from the channel center 11 of the second channel 11' corresponds to the spacing of the frequency position $f_s$ of the original instantaneous frequency 14" with respect to the channel center 14 of the source channel or first channel 14'.

The first step 17 of the frequency shift is merely a rough channel-wise shift. It is unlikely that with its shift the sound 14" will actually land at a frequency position which immediately emerges from a frequency compression characteristic. FIG. 4 shows a frequency position $f_d$ at which the sound 14" would actually land if the mapping takes place with a predefined compression characteristic. The aim of the present invention is therefore to carry out a further shifting step after the first step 17 to shift the shifted sound 11" to the final frequency position $f_d$, resulting in the target sound 18. For this purpose the shifted sound 11" is shifted by way of amplitude modulation in a second step 19. Shifting is by the amount $\Delta f$ here. The sound is therefore shifted to its final position $f_d$ in the second step 19.

By defining a continuous mapping characteristic from source to target frequency it may basically be ensured that frequencies do not appear mixed up in their sequence at the output. To achieve such a continuous mapping characteristic in the hearing aid a combination of selective channel mapping and amplitude modulation is used in the present exemplary embodiment. The channel mapping ensures that, as has already been described in detail, a certain frequency range (first frequency channel 14') is firstly roughly mapped into another range (second frequency channel 11'), similar to known methods. By measuring the dominant instantaneous frequency $f_s$ in the source channel 14' it may be exactly determined by way of the mapping characteristic to where this has to be mapped in the target channel (11'). By way of corresponding modulation of the channel 11' the dominant instantaneous frequency can be exactly modulated to the location where it is expected according to the mapping characteristic.

This method may advantageously be used with a polyphase filter bank which only produces the complex-valued, analytical signal (only positive frequency component of a Fourier transformation) in the channels. Each channel may be cyclically modulated here by means of modulation with a modulation term $\exp(j\cdot 2\pi\Delta f\ t)$, so the frequencies therein are accordingly cyclically shifted by the angular frequency $\Delta w=2\pi\Delta f$.

Basically a distinction should be made between two cases when measuring or estimating the dominant instantaneous frequency:

a) There is one dominant frequency which can be estimated, i.e. there is a strong tonal component in this channel. Mapping to a target frequency can therefore take place.

b) There is no dominant frequency, i.e. the signal in the channel is noisy. The frequency estimate leads to a more or less random instantaneous frequency. When mapping to a target frequency this in turn leads to a phase randomization or random modulation in the channel, and this barely affects the auditory impression in the case of noisy channels.

To this extent the method may be applied irrespective of the tonality of the channel since no negative effects need be feared in the case of noisy components.

Figure 3:
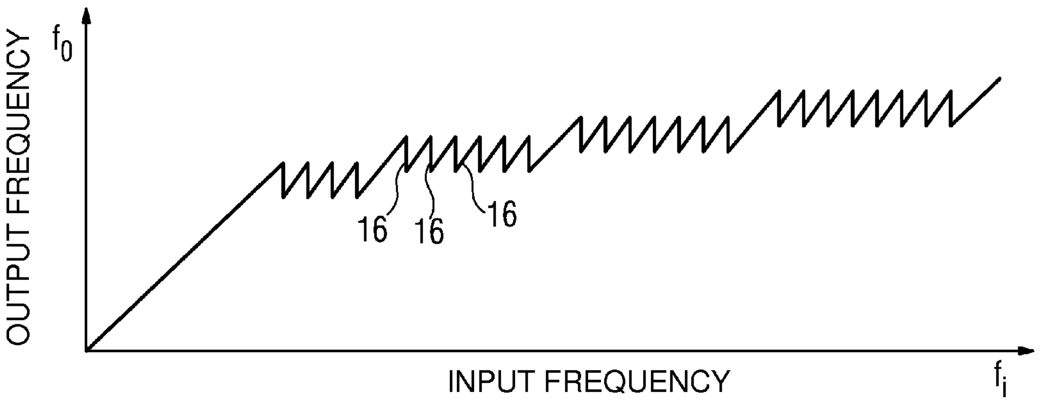
FIG 3 Prior art
FIG. 3 shows a frequency transmission function of the compression according to FIG. 2 according to the prior art.
Figure 5:
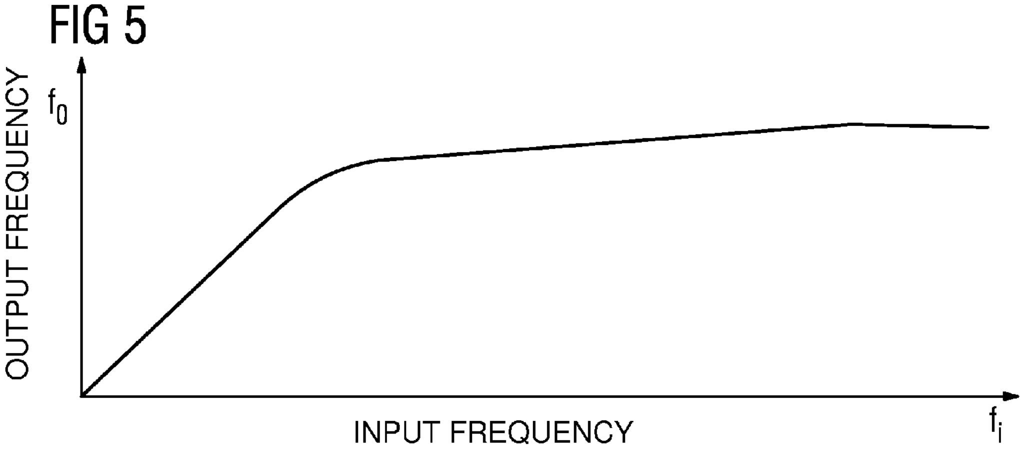
FIG. 5 is a graph illustrating the measured frequency transmission function with compression according to FIG. 4.

FIG. 5 shows the measurement result of the inventive frequency compression. As in FIG. 3 the output frequency $f_o$ is again shown on the ordinate and the input frequency $f_i$ on the abscissa. A frequency sweep is applied to the input. A continuous frequency characteristic is produced by modulation in the target channel. The allocation of source frequency to target frequency is called a compression characteristic. Frequency hops therefore no longer occur and thus no artifacts relating thereto either.

The two-stage frequency shifting method according to the present invention can be carried out in two variants:

a) The mapping rule of the channels is fixed and a modulation is impressed only within the channels. This means that the allocation of the various source channels to a target channel is known in advance. A modulation is then performed within the target channel, so the desired target frequency exists in the target channel owing to the estimated instantaneous frequency of the selected source channel and the mapping rule.

b) The mapping between channels is not specified. Instead it is fixed on the basis of the mapping characteristic and the estimated instantaneous frequency. A modulation is also impressed as in the first variant. This means that the allocation of the various source channels to a target channel is determined during operation and the mapping characteristic is used for both the allocation of the various source channels to a target channel and for the subsequent modulation within the target channel. This makes use of the fact that the channels of a filter bank typically overlap and various allocations of source channels to target channels with different modulations would lead to a similar result. It is advantageous in this connection to configure the mapping in such a way that the instantaneous frequency is located close to the band center in both the source and target channels since artifacts are then minimized by modulation.

The mapping rule of source to target frequency must be provided by suitable audiology means. Mapping can typically be carried out with the aid of a BarkERB or Spinc frequency distribution, as is described in document EP 1 333 700 A2.

Figure 6:
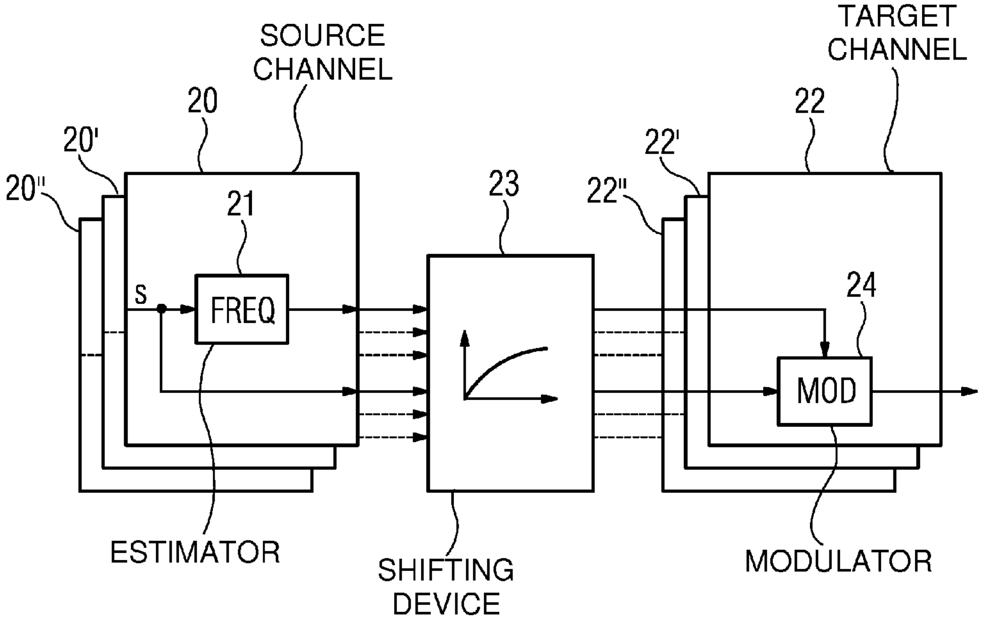
FIG. 6 shows a block diagram of a device for frequency compression according to the invention.

FIG. 6 shows a block diagram of a possible embodiment of an inventive frequency compression device. The instantaneous source frequency $f_s$ is estimated by an estimator 21 in each source channel 20, 20', 20" of the filter bank. Based on the allocation scheme of frequency compression (derived from the compression characteristic) and the signal s of the dominant instantaneous frequency a source channel 20, 20', 20" is allocated to each target channel 22, 22', 22" by a shifting device 23. The allocation scheme can either be fixed, i.e. a fixed choice of source channels 20, 20', 20" are allocated to a single target channel, or variable, i.e. for each source channel 20, 20', 20" it is determined to which target channel 22, 22', 22" it will be allocated as a function of the frequency estimate and the compression characteristic. In the target channel the signal from the selected source channel is modulated by means of amplitude modulation by a modulator 24 in such a way that mapping of source frequency to target frequency corresponds exactly to the compression characteristic.

The invention claimed is:

1. A method for frequency compression of an audio signal, the method which comprises:

providing the audio signal in a plurality of frequency channels including a first frequency channel;

determining a dominant instantaneous frequency having a strong tonal component in the first frequency channel;

shifting or mapping a component of the audio signal from a first frequency channel of the plurality of frequency channels into a second frequency channel of the plurality of frequency channels;

the shifting or mapping including:

firstly shifting or mapping the entire first frequency channel, including the dominant instantaneous frequency, into the second frequency channel, with the dominant instantaneous frequency obtaining an intermediate frequency position, wherein a shifted frequency range is mapped onto a smaller, more audible frequency range;

determining a final frequency position for the dominant instantaneous frequency by a predefined compression characteristic in the second frequency channel, starting from the frequency position of the dominant instantaneous frequency in the first frequency channel; and shifting or mapping the dominant instantaneous frequency from the intermediate frequency position to the final frequency position.

2. The method according to claim 1, wherein the step of shifting or mapping of the dominant instantaneous frequency from the intermediate frequency position to the final frequency position comprises carrying out amplitude modulation.

3. The method according to claim 1, which comprises strictly predefining the second frequency channel for shifting or mapping the first frequency channel.

4. The method according to claim 1, which comprises determining the second frequency channel with the aid of the compression characteristic for shifting or mapping the first frequency channel.

5. The method according to claim 4, which comprises choosing as the second frequency channel a frequency channel from a plurality of possible frequency channels in which the dominant instantaneous frequency is arranged next in a respective channel center.

6. A device for frequency compression of an audio signal, comprising:

a first shifting device for shifting or mapping a component of the audio signal, which is provided in a plurality of frequency channels, from a first frequency channel of the plurality of frequency channels into a second frequency channel of the plurality of frequency channels;

an estimator for determining a dominant instantaneous frequency in the first frequency channel, wherein said first shifting device is configured to shift or map an entire first frequency channel, including the dominant instantaneous frequency, into the second frequency channel in such a way that a dominant instantaneous frequency obtains an intermediate frequency position, wherein a shifted frequency range is mapped onto a smaller, more audible frequency range;

a calculating device for determining a final frequency position for the dominant instantaneous frequency by way of a predefined compression characteristic in the second frequency channel, starting from the frequency position of the dominant instantaneous frequency in the first frequency channel; and a second shifting device for shifting or mapping the dominant instantaneous frequency from the intermediate frequency position to the final frequency position.

7. The device according to claim 6, which comprises a polyphase filter bank for providing the audio signal in the plurality of frequency channels.

8. A hearing apparatus, comprising an input for receiving an audio signal and a device according to claim 6.

* * * * *